United States Patent [19]
Whittaker et al.

[11] Patent Number: 5,850,513
[45] Date of Patent: *Dec. 15, 1998

[54] PROCESSOR PATH EMULATION SYSTEM PROVIDING FAST READOUT AND VERIFICATION OF MAIN MEMORY BY MAINTENANCE CONTROLLER INTERFACE TO MAINTENANCE SUBSYSTEM

[75] Inventors: Bruce Ernest Whittaker, Mission Viejo; James Henry Jeppesen, III, Lake Forest, both of Calif.

[73] Assignee: Unisys Corporation, Blue Bell, Pa.

[ * ] Notice: The term of this patent shall not extend beyond the expiration date of Pat. No. 5,706,424.

[21] Appl. No.: 583,326

[22] Filed: Jan. 5, 1996

[51] Int. Cl.$^6$ .............................. G06F 11/00; G06F 13/16
[52] U.S. Cl. ................................ 395/185.02; 395/182.03; 395/185.07; 395/308; 371/21.1
[58] Field of Search ......................... 395/185.02, 182.02, 395/182.03, 183.05, 250, 427, 439, 496, 430, 842, 185.07, 308, 200.63, 200.83; 364/238.3, 239, 242.3, 260; 371/21.1, 21.2, 20.2, 25.1; 711/100, 112, 103, 115

[56] References Cited

U.S. PATENT DOCUMENTS

| | | |
|---|---|---|
| 4,403,282 | 9/1983 | Holberger et al. ....................... 395/842 |
| 4,471,427 | 9/1984 | Harris ....................................... 395/842 |
| 5,459,850 | 10/1995 | Clay et al. .......................... 395/497.02 |
| 5,495,573 | 2/1996 | Datwyler et al. .................. 395/185.01 |
| 5,509,127 | 4/1996 | Datwyler et al. ........................ 395/308 |
| 5,537,609 | 7/1996 | Whittaker et al. ....................... 395/800 |
| 5,553,249 | 9/1996 | Datwyler et al. ........................ 395/308 |
| 5,574,883 | 11/1996 | Freeman ................................... 395/446 |
| 5,581,741 | 12/1996 | Clark et al. .............................. 395/500 |
| 5,596,738 | 1/1997 | Pope ......................................... 395/430 |
| 5,706,424 | 1/1998 | Whittaker et al. ................. 395/185.07 |
| 5,737,567 | 4/1998 | Whittaker et al. ....................... 395/308 |

*Primary Examiner*—Dieu-Minh Le
*Attorney, Agent, or Firm*—Alfred W. Kozak; Mark T. Starr; Steven R. Petersen

[57] ABSTRACT

A central processing module (CPM) uses a data path array interface connecting dual system busses to a main memory module and I/O module. A maintenance controller in the CPM manages a programmable array logic unit controller to read out microcode words in the main memory module to verify their accuracy by comparison with an original data base of microcode words in a flash memory which was earlier pre-loaded from a maintenance subsystem. A high speed auxiliary data bus controlled by the programmable array logic controller, provides a high speed transfer channel for moving the main memory words to the maintenance controller which can then institute a verification procedure for each memory word.

6 Claims, 7 Drawing Sheets

FIG. 4 great 5,850,513

PROCESSOR PATH EMULATION SYSTEM PROVIDING FAST READOUT AND VERIFICATION OF MAIN MEMORY BY MAINTENANCE CONTROLLER INTERFACE TO MAINTENANCE SUBSYSTEM

REFERENCES TO RELATED APPLICATIONS

This application is related to U.S. Pat. No. 5,706,424 filed Oct. 23, 1995 entitled "System for fast read and verification of microcode RAM" and also related to U.S. Pat. No. 5,737,567 filed Oct. 23, 1995 entitled "Fast write initialization system for microcode RAM via data path array using pre-loaded flash memory and programmable control logic array".

FIELD OF THE INVENTION

A system for enabling the maintenance subsystem of a computer network to rapidly read and verify data in main memory connected to the network.

BACKGROUND OF THE INVENTION

Figure 3A:
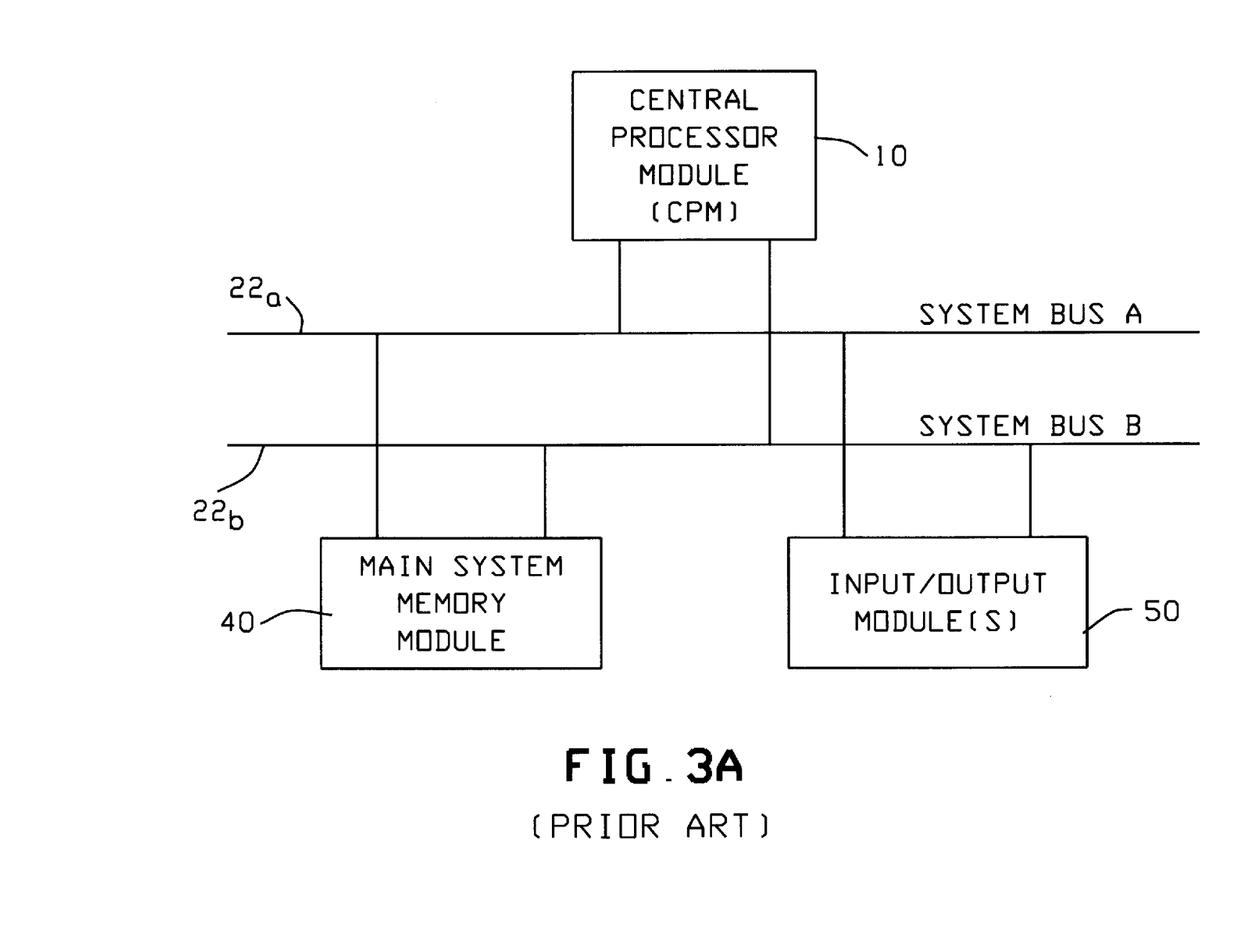
FIG. 3A is a generalized block diagram of a basic computer network connected to dual system busses.

A simplified network illustrating a computing system is seen in FIG. 3A which shows the basic elements of a central processing module (CPM) 10, a Main Memory Module 40 and an Input/Output Module 50. These modules are interconnected via a dual system bus structure shown as having two system busses 22a and 22b. These busses are interchangeable system busses and provide parallel redundant transfer paths.

Figure 3B:
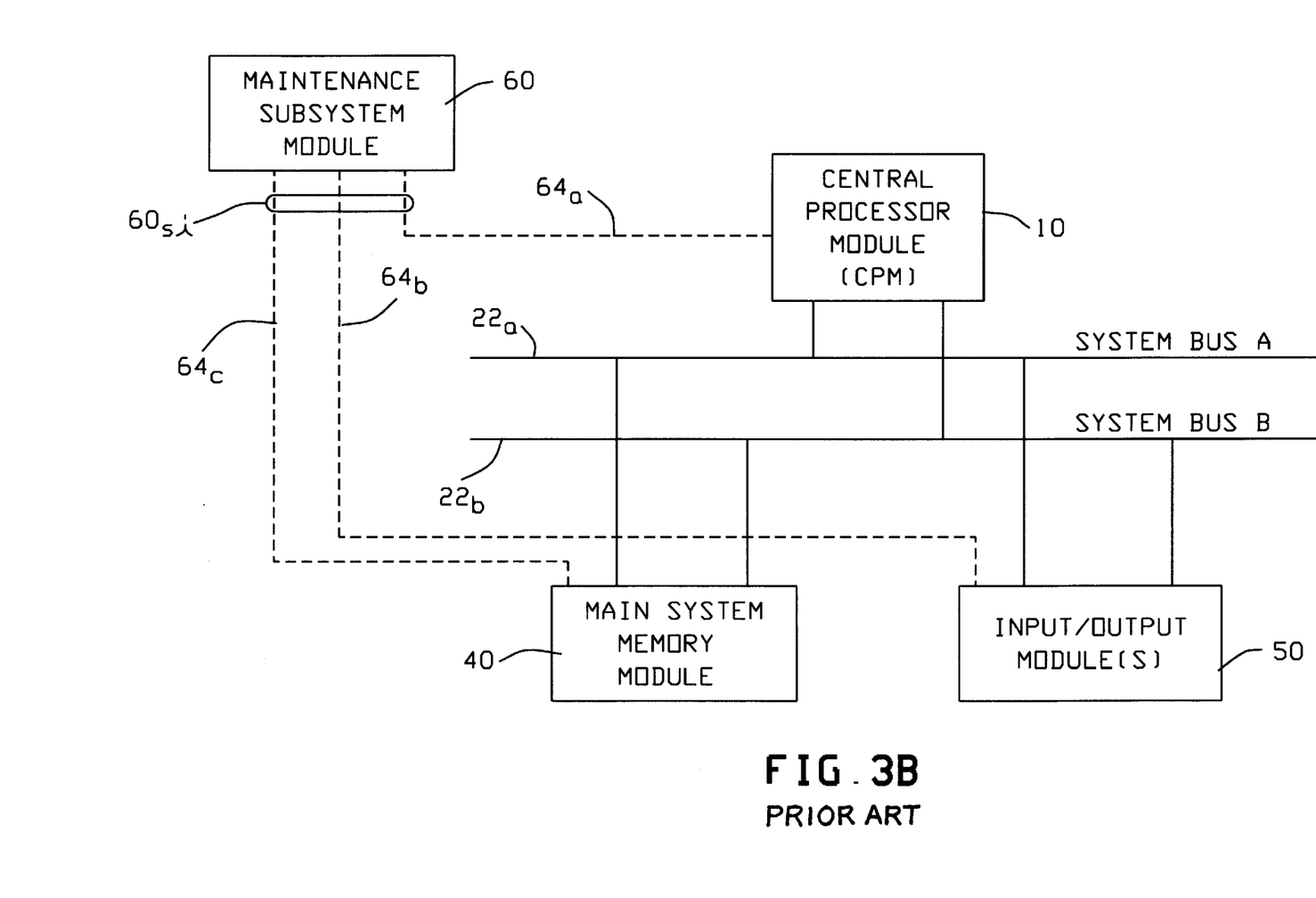
FIG. 3B is a block diagram of a basic computer network using a maintenance subsystem connected to the computer network by slow bit-serial data transfer and control lines.

The network of FIG. 3A is seen enhanced with the addition of a Maintenance Subsystem Module 60 which is shown in FIG. 3B. The Maintenance Subsystem Module 60 provides both diagnostic functions to all of the modules in the network but is also required to "initialize" all the system modules and to "start-up" the system for operation. In FIG. 3B, the Maintenance Subsystem 60 is shown connecting to all of the system modules by means of a dashed line series of connections 64a, 64b and 64c. These connections represent the basic maintenance connections of a JTAG integrity system such as is specified in IEEE 1149.1. The IEEE 1149.1 specification is an industry standardized type of interface which provides a bit-serial data transfer between the various targeted modules of the network and the Maintenance Subsystem 60.

All the various system modules in the network are setup or "initialized" for system operation through the bit-serial interface lines 64a, 64b, and 64c. This type of interface is a system compromise between cost and performance. It is inexpensive cost-wise since it is standard and only uses a few wires but slow in performance since it is a bit-serial data transfer operation.

However, the bit-serial aspect of data transfer also makes it a an especially slow operation when massive amounts of information must be transferred. In many systems this is tolerable because the system initialization does not require an excessive amount of data transfer to most of the interconnecting modules in a network.

In the architecture of FIG. 3B, the case is presented where inordinate and significant time periods are lost when initialization is effectuated by only using the standard JTAG interface, 60si, especially when it is desired to transfer "channel microcode" instructions for the I/O module 50.

Figure 2:
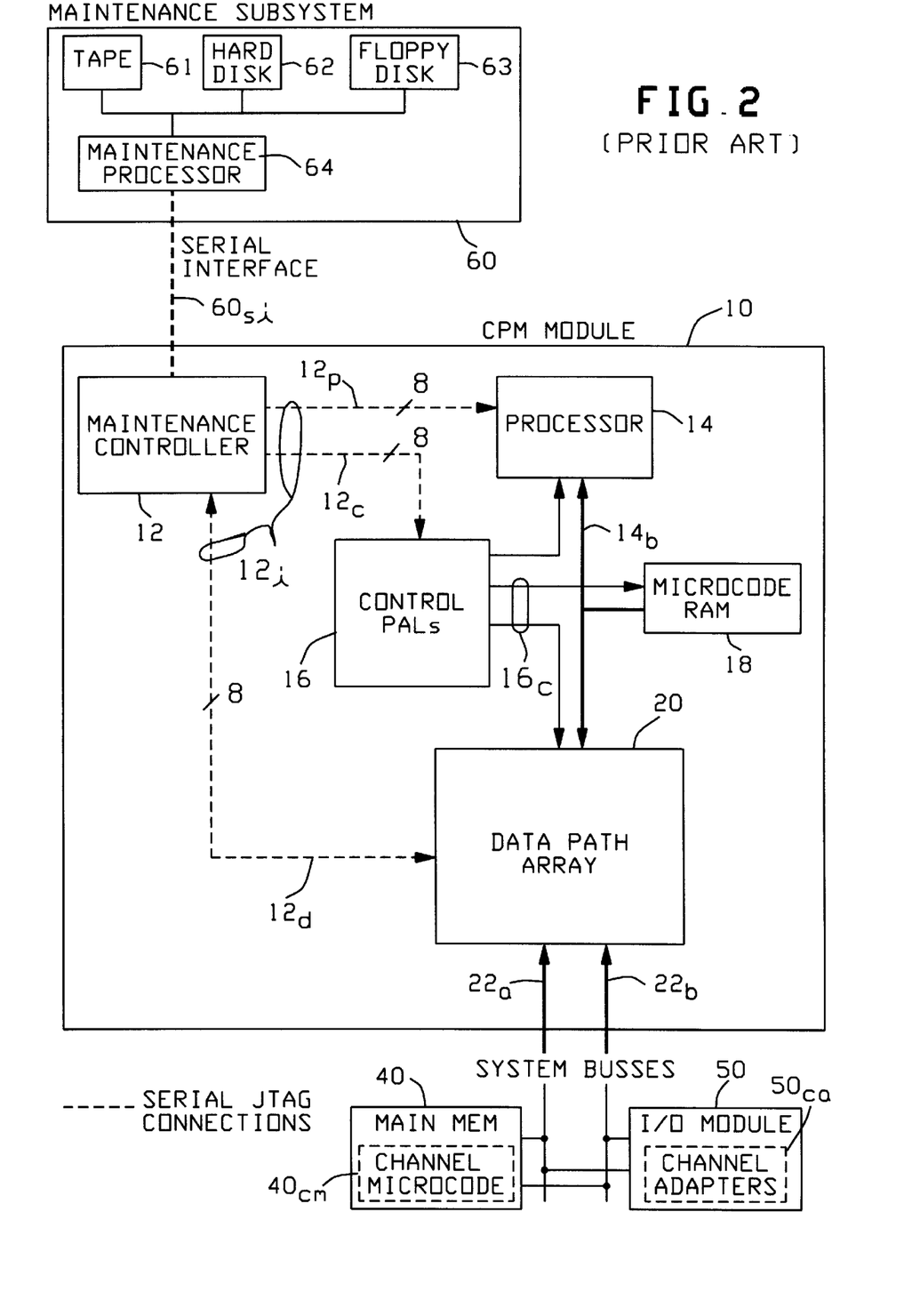
FIG. 2 is a network diagram of an earlier architecture which used slow bit-serial transfers and JTAG transfer lines for transferring data.

One type of central processing module 10 (CPM) is shown in FIG. 2 connected to a Maintenance Subsystem 60. The Maintenance Subsystem 60 is seen to have a maintenance processor 64 with several peripheral units attached, such as cartridge tapes 61, hard disk 62, and floppy disk 63. These devices can be used to provide the large database information that may be necessary to set-up the system for operation. The serial interface between the Maintenance Subsystem 60 and the central processing module 10 is shown on serial interface line 60si which connects the maintenance processor 64 from the maintenance subsystem 60 over to the maintenance controller 12 of the CPM module 10.

Also seen in FIG. 2 are the major elements of the processor logic in the CPM 10. These include the processor 14, the Data Path Array 20, the Control PAL 16 and the microcode RAM 18 which holds the instruction codes for the processor 14. It will be seen that the processor 14 can access the major system modules 40 and 50 via the system busses 22a and 22b through the on-card Data Path Array 20. The data path array converts from the on-card high speed processor bus 14b over to the slower inter-module system busses 22a and 22b. The soft, flexible Control PALs 16 is used to provide control of these system busses and also the data path array operations.

In FIG. 2, the dashed lines are used to show the on-card versions of the serial JTAG connections which are indicated as 12p, 12c and 12d. Once initialization of a system has been completed in FIG. 2, these JTAG connection lines are no longer essentially used.

Figure 3C:
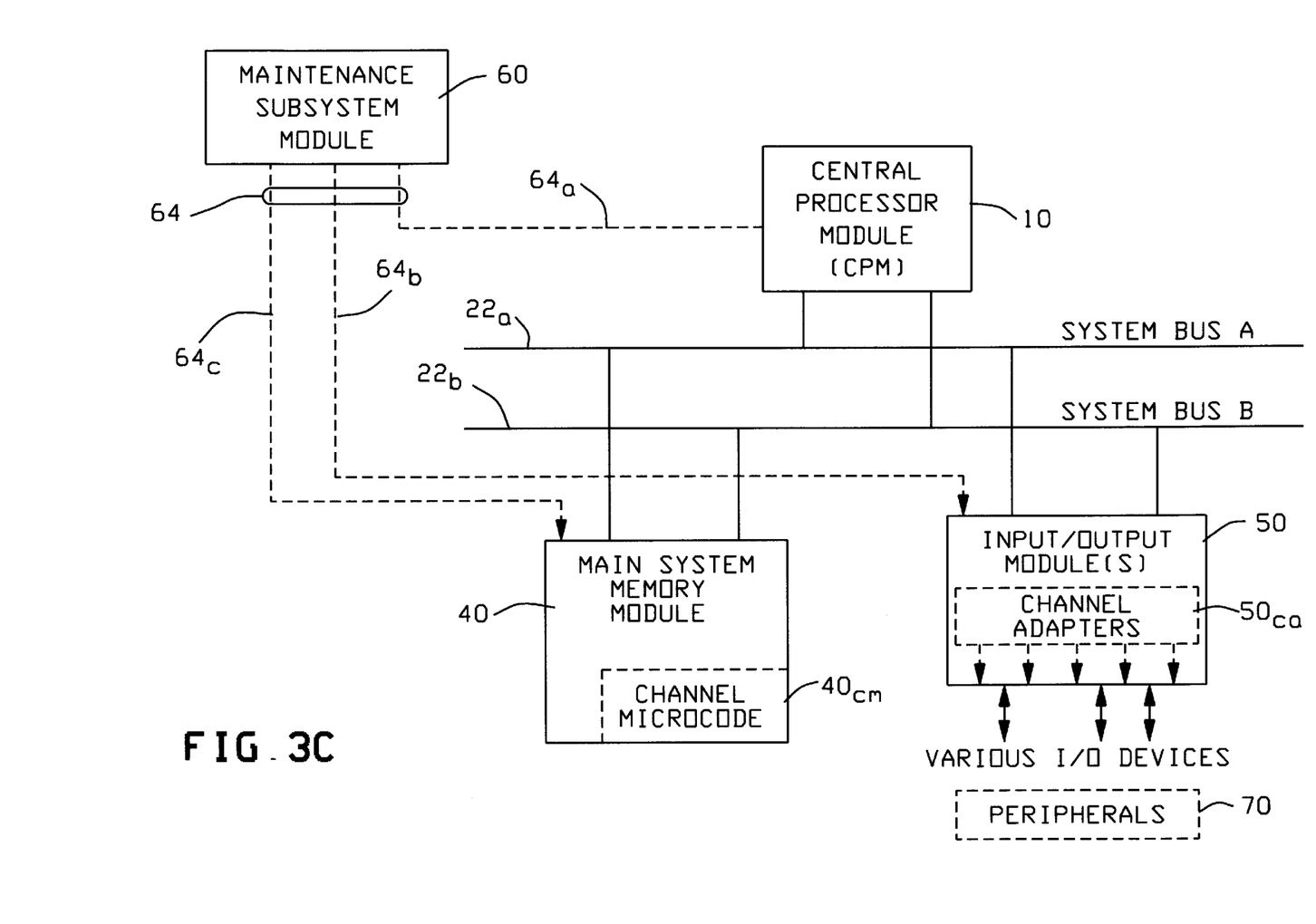
FIG. 3C is a diagram of a computer network with a maintenance subsystem and indicating the dedicated section in main memory for channel microcode and also the use of channel adaptors in the input/output module.

Another view of the computer network is illustrated in FIG. 3C where the Input/Output Module 50 is seen to have a dedicated unit for channel adapters 50ca and in which the main system memory module 40 is seen to have a dedicated section 40cm for holding the channel microcode words. The Input/Output Modules 50 connect to various peripherals 70 and are under control of the channel adapters 50ca which provide the appropriate protocol and timing for communication purposes.

The channel microcode area 40cm in main memory 40 of FIG. 3C is a dedicated repository for channel microcode instructions which enables the channel adapters 50ca of the Input/Output Module 50 to control and communicate data transfers between I/O module 50 and various types of peripherals 70.

For efficiency of design and of production, it is most desirable to make as few types of unique hardware units as possible, that is to say, it is optimum to use identical hardware to accomplish many different tasks. Thus, the I/O module 50, although it must interface with many different types of peripheral devices 70 (for example, SCSI disks, tapes, printers and etc.) may optimally use identical or very similar hardware to accomplish this. Each I/O device interface is accomplished via a Channel Adapter 50ca. These channel adapters which are used are essentially identical hardware. Then to allow each adapter to properly interface to the different interface and device protocols, requires a unique "driver" software using the "channel microcode" to run each of the channel adapters 50ca.

At the original system initialization period, the Maintenance Subsystem 60 is sensitive to the system I/O device configurations and connections. Because of this, it must load the appropriate "channel microcode" into the appropriate locations in Main Memory 40, shown as repository 40cm in FIG. 3C. When the I/O module 50 is initialized and running, it will then access the appropriate "channel microcode" for each peripheral device, from the unit 40cm of the main system memory 40, and then bring this into the channel adapters 50ca for normal system operation.

The power of having "soft" microcode routines is that somewhat standardized I/O hardware can be used to implement numerous types and various types of I/O device connectivity. This flexibility comes at the cost of having to load up (Write) the channel microcode into the dedicated channel microcode repository 40cm of Main Memory 40. This must be done each time that the system is initialized.

Such systems as indicated in FIG. 3C are essentially known for loading the channel microcode since it was done through the JTAG bus 64 which has various sub-bus lines 64a, 64b, and 64c. The presently described system in FIG. 1 will be seen to operate a verification function to eliminate the long time periods necessary to read and transfer data from the channel microcode repository $40_{cm}$ back to a maintenance controller 12 which has a flash memory 15 holding the original channel microcode data which can be used to verify the channel microcode data which has been read back from the main memory 40.

Earlier architectures and systems were very inefficient in regard to the loading of channel microcode into main memory. If the logic and architecture were implemented only as shown in FIGS. 2 and 3C, then it would still be possible to provide for the necessary writing of channel microcode into Main Memory 40. But, however, there would be a quite significant delay, even to the extent of several minutes, each individual time that the system was initialized and each time that there as a readback and verification. Thus, in the systems of FIG. 2 and FIG. 3C, it could be remarked that there were two levels of inefficiency (i) (ii) in regard to the loading up and writing in of channel microcode into the Main Memory Module 40 after which the readback verification cycle could be executed.

(i) Transfer Path from Disk or Tape to Main Memory

The first undesirable inefficiency in the loading of channel microcode into the dedicated section 40cm of FIG. 3C would involve the source of the microcode data to be loaded. The source of the microcode data will be seen from FIG. 2 and FIG. 3C as originating from the cartridge tape 61 or from one of the disks 62, 63 which connect directly to the Maintenance Processor 64. Normally, unless a new release of microcode data words were being loaded, the source would normally and logically be the hard disk 62. However, it should be noted that every byte of the channel microcode data would have to be transferred over the serial interfaces 64a, 64b, and 64c, between the Maintenance Subsystem 60 and the various system modules 40 and 50. Then on read-back of the channel microcode in Main Memory 40 there would be a slow transfer of data on JTAG line $12_d$ to Maintenance Controller 12 then via serial interface line $60_{si}$ to the Maintenance Processor 64 for verification of the channel microcode.

The protocol involved on the serial interface $60_{si}$ of FIG. 2 and 3C is not feasible for allowing "bursts" of data transfer but instead requires several detailed actions of protocol operations for "each byte" of data transferred. For ordinary diagnostic operations, this seeming inefficient serial transfer method is normally sufficient. However, in network situations where there are large or massive amounts of channel microcode data which must be loaded, then read back and verified by the Maintenance Subsystem 60 each time the system is initialized, then the overhead involved in the serial interface 60si for transferring the read-back data from memory for comparison with the original data in disk 62 is relatively very significant and very inefficient.

(ii) Channel Microcode Read and Verify Loop (FIG. 2)

The second inefficiency of the earlier art seen in FIG. 2 and 3C is that the standard JTAG interface 12si (12p, 12d, 12c) used in the central processing module 10 (CPM) involves connections for all of the on-card components of CPM 10 to the maintenance controller 12 (FIG. 2). Again, for ordinary and standard diagnostics of the central processing module 10, this bit-serial interface 12si is useful and relatively cost effective. However, for loading of the channel microcode data from the Maintenance Subsystem 60 into the Main Memory 40 via the JTAG bit-serial connection via bus 60si and the JTAG bus 12d, it is apparent that the slowness of this transfer operation would be unwanted and often unacceptable. This slowness of transfer is further compounded on read-back of the main memory channel microcode back to the Maintenance Controller 12 which then conveys the read-back data to the Maintenance Processor 64 for comparison with the original microcode data in disk 62 or disk 63.

Thus, by using only the JTAG serial connections 12p, 12c and 12d, it is still possible to write into the dedicated channel microcode area 40cm in the Main Memory 40 and then read back the channel microcode for verification by the Maintenance Processor 64. However, this procedure would require a complex protocol with separate items to be shifted by the Maintenance Subsystem 60 according to the series of steps (a)–(f) indicated hereinbelow using the FIG. 2 configuration.

(a) The maintenance processor 64 (FIG. 2) shifts the main memory address value into the Data Path Array 20 by using the serial interface 60si and the JTAG bus 12d.

(b) The maintenance processor 64 will shift the appropriate control states via 12c into the control PAL 16 in order to cause a system bus Read operation to occur on busses $22_a$, $22_b$ from the main memory 40.

(c) It may be noted that the above step (b) actually requires several steps to sequence through the appropriate bus protocol steps.

(d) The maintenance processor 64 will signal the data path array 20 and cause the channel microcode word which had been read from main memory 40, out of the data path array 20 and over the JTAG path $12_d$ through the maintenance controller 12 and the serial interface $60_{si}$ over to the maintenance processor 64.

(e) Maintenance software in the maintenance subsystem 60 will then check and verify each channel microcode word that had been read out from memory 40, against the data base held in the hard disk 62 of the maintenance subsystem 60.

(f) Then there is required a repetition of steps (a) through (e) for each one of the channel microcode words which were read out from the main memory 40, and passed on to the data path 20 and transferred on line $12_d$ through the maintenance controller 12 and the serial interface $16_{si}$ through to the maintenance processor 64 so that each word can be verified against data in the hard disk 62.

The above steps (a) through (f) will be seen to entail many bit serial shifts of some very long flip-flop shift chains, in some cases involving over 2,000 flip-flops. Thus, with the above cumbersome procedure, controlled by the maintenance software running in maintenance processor 64, it is possible to read each channel microcode word from the main memory 40 and pass it over to the maintenance processor 64 for verification, but this reading and verification process will be very slow, possibly on the order of several long minutes. However, as will be indicated later, the improved and enhanced system and method disclosed herein will enable a much faster Read and verify of the channel microcode at virtually no additional hardware cost.

Thus, it is an object of the present system to overcome the long transfer times characteristic of the earlier systems and provide for a rapidly efficient read and verification of data from main memory in a rapid fashion which does not entail long waiting periods.

SUMMARY OF THE INVENTION

A computer network utilizes a Central Processing Module which is connected to a maintenance subsystem on one end and has dual system busses which connect to a main memory and I/O module at the other end. The I/O module has channel adaptors for communicating with various types of peripheral units. However, in order to operate, the I/O module must access channel microcode routines from the main memory module. The main memory module must be loaded with the channel microcode during the initialization period and further, the channel microcode must be read back and verified as to its accuracy before actual operations begin. Earlier systems took relatively long periods of time to read out the channel microcode from main memory and pass it back to a maintenance subsystem so that each word of channel microcode could be verified as being accurate.

The present system provides a maintenance controller and specialized transfer bus connected to a data path array which is controlled by a programmable array controller so that rapid transfer of channel microcode data from main memory can be passed though the data path array on to a maintenance controller through the transfer bus whereupon the maintenance controller has a pre-loaded flash memory holding the original microcode data which can then be used to check out and verify each word of the channel microcode which had been placed in the main memory. Thus, there is no need for the verification cycle to be slowed down and delayed by having to use the slow serial interface to the maintenance subsystem. The maintenance controller, specialized transfer bus and the programmable array controller provide an emulation of the high speed transfer operations of the central processor, its processor bus and its microcode cache thus enabling a high speed operation of data transfer comparable to the high speed processor bus.

DESCRIPTION OF PREFERRED EMBODIMENT

Figure 1:
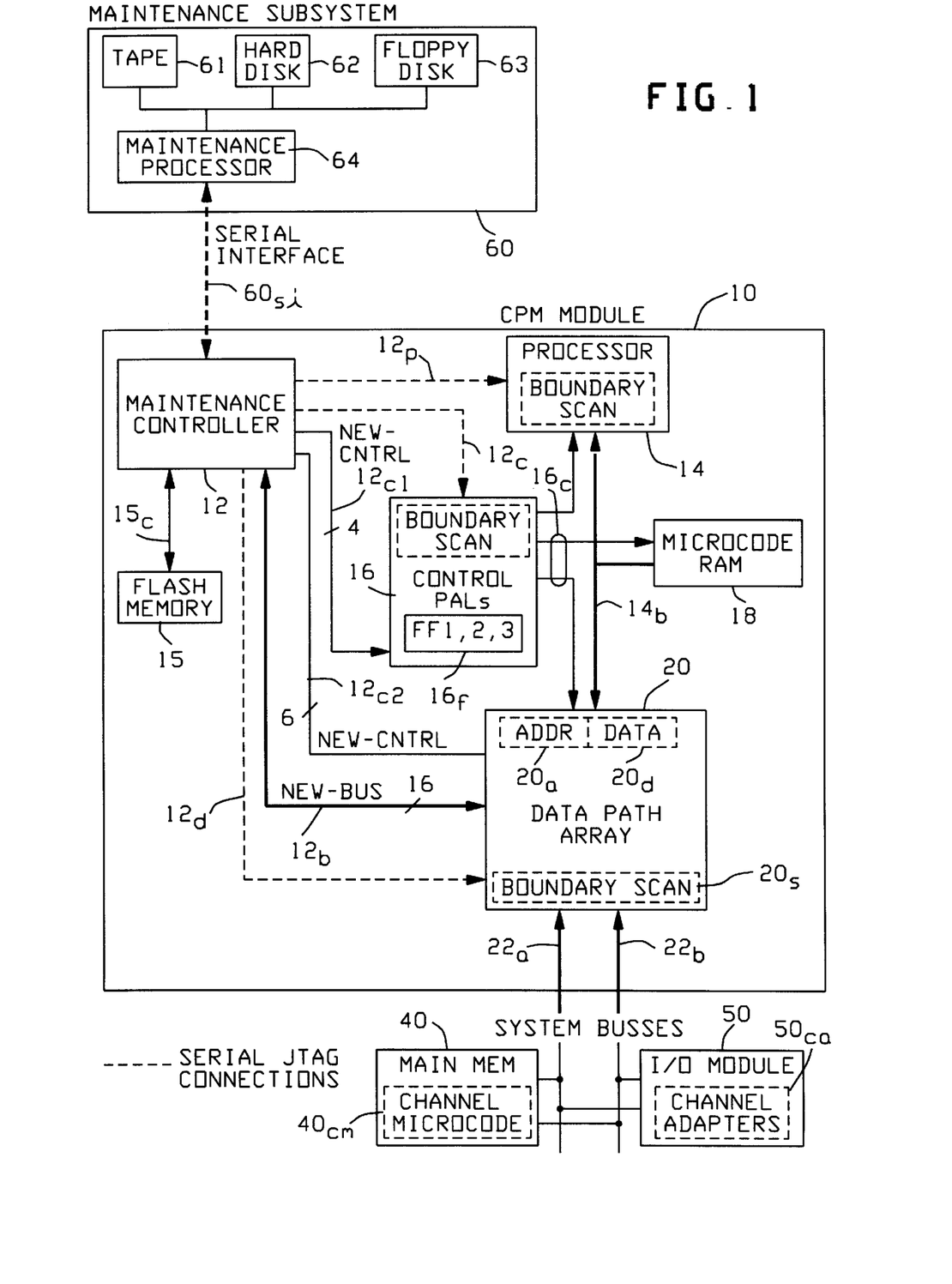
FIG. 1 is a drawing of the enhanced network for reading out microcode from main memory and transferring it to a maintenance controller for verification of accuracy in a rapid fashion.

FIG. 1 shows the enhanced system for the fast read-out of channel microcode from main memory 40 through the data path array 20 over the transfer bus $12_b$ to the maintenance controller 12 which uses its pre-loaded flash memory 15 to check the microcode words read out from main memory 40. The network, seen in FIG. 1, indicates a maintenance subsystem 60 connected to Central Processing Module 10 through a serial interface $60_{si}$. The Central Processing Module 10 is connected through a data path array 20 using dual system busses 22a and 22b to a main memory 40 and an input/output module 50. The main memory 40 has a dedicated repository $40_{cm}$ for holding the channel microcode which is used by the channel adaptors $50_{ca}$ in the I/O module 50 for communicating to specialized peripheral devices which require specialized instructions and protocol provided by the channel microcode.

The Central Processing Module 10 has a maintenance controller 12 which communicates with the maintenance sub-system 60 in order to allow the pre-loading of microcode data from the maintenance subsystem 60 over to a flash memory 15, which then can make the channel microcode data readily available for distribution without the need to wait for transmission from the maintenance system via the slow serial interface $60_{si}$. A data path array 20 uses a processor bus $14_b$ to communicate with the processor 14 and the microcode RAM 18. A programmable array logic controller designated Control PAL 16 provides control signals to the processor 14, the microcode RAM 18 and the data path array 20 for the handling of data transfers.

In the enhanced system of FIG. 1, the maintenance controller 12 provides a high speed, high capacity transfer bus 12b between the maintenance controller and the data path array 20 in addition to providing two control channels $12_c1$ to the Control PAL 16 and $12_c2$ to the data path array 20. The diagnostic JTAG lines $12_p$, $12_c$ and $12_d$ are only used for diagnostic purposes and are no longer needed for transfer of microcode data words as was done in the earlier architecture.

The flash memory storage RAM 15 is a non-volatile unit which allows for a pre-loaded method of storing microcode data within the Central Processing Module itself, so that it is not necessary to wait for subsequent loading from the maintenance subsystem or for the transfer of read-back data to the maintenance processor 64 for verification. The flash memory 15 provides a large capacity on-card storage facility for the maintenance controller 12 within the Central Processing Module 10.

Under normal conditions with the improved system of FIG. 1, the maintenance subsystem 60 will pre-load channel microcode into the flash memory RAM 15. Then on system initialization, the channel microcode will be transferred from the database stored within the flash memory RAM 15 and passed over transfer bus $12_b$ to the data path array 20 after which it can be loaded onto one or other of the system busses $22_a$ or $22_b$ for deposit in the main memory repository section $40_{cm}$ dedicated to channel microcode. This is accomplished with control signals provided by the programmable array logic Control PAL 16.

The transfer path 12b is very fast when compared to the serial path $60_{si}$ and the JTAG path $12_d$ as was previously used and shown in FIG. 2. Only when there is a "new set" of channel microcode words being added to the system, does the channel microcode data base require transfer over the serial interface $60_{si}$ from the tape cartridge 61 or the hard disk 62. Further, at this time, the flash memory RAM 15 will be updated with a new data base for the new channel microcode items.

Enhanced Channel Microcode Read Loop

As seen in FIG. 1, there has been added two new direct sets of control lines $12_c1$ and $12_c2$ in addition to a new direct transfer bus $12_b$ from the maintenance controller 12 to the data path array 20 in order to provide for a channel microcode read loop. This enhanced loop then allows the maintenance controller 12 to utilize the fast wide parallel paths of bus $12_b$ through the data path array 20 and over to the main memory 40 via the system busses $22_a$ and $22_b$, rather than having to use the previous slow, serial JTAG path $12_d$ and the JTAG control lines $12_d$ and $12_c$. These new direct lines allow the maintenance controller 12 to emulate the actions that the processor 14 would normally have to take if it were reading out data from the main memory 40.

Data Path Array (FIG. 1)

The data path array 20 of FIG. 1 provides the connection between the processor bus $14_b$ on one side and the system busses $22_a$ and $22_b$ on the other side. The data path array has a path for addresses and a path for data information which can then be read out from the main memory 40 via the system busses $22_a$ and $22_b$. This is done under direction of the Control PAL 16 using the control lines $16_c$. The data path array 20 will be seen to have an address register $20_a$ and a data register $20_d$ for temporarily holding addresses and data read out from main memory destined for subsequent transfer to the maintenance controller 12 for verification.

Under the earlier art, for each word read out from main memory and placed in the data path array 20, the values for the address data and the microcode channel data had to be shifted serially by means of the JTAG path $12_d$ into the boundary scan area $20_s$ of the data path array. After this, and under the control of the programmable array logic Control PAL 16, the addresses and data in the data path array 20 could be transferred to the maintenance controller 12 and then transferred on the slow serial interface $60_{si}$ to the maintenance processor 64 for verification.

In the enhanced configuration of FIG. 1, there is provided the additional parallel transfer bus path $12_b$ onto the data path array 20 from the maintenance controller 12. Further, the new direct interface connections include four control signals on lines $12_c1$ and six control signals on lines $12_c2$, plus the 16-bit data transfer bus $12_b$ (MP_DATA). By using the 16-bit direct transfer bus $12_b$, this permits the necessary wider fields (addresses equal 32 bits; data equals 52 bits) to be much more quickly built up from the data path array 20 than could possibly have been done using the earlier serial JTAG shifting method. The signals involved in the new direct interface are described below in Table I.

TABLE I

| MP_LADDB | Signal from the Maintenance Controller 12 causing the current value on the MP_DATA bus 12b to be loaded into the selected upper portion of the data path array address register, 20a. |
|---|---|
| MP_STRDATLB | Signal from the Maintenance Controller 12 causing the current value on the MP_DATA bus to be loaded into the selected lower portion of the Data Path Array data register, 20d. (Not used for reading data). |
| MP_STRDATUB | Signal from the Maintenance Controller 12 causing the current |

TABLE I-continued

| | value on the MP_DATA bus 12b to be loaded into the selected upper portion of the Data Path Array data register. (Not used for reading data). |
|---|---|
| MP_REGSEL(1:0) | Two signals from the Maintenance Controller 12 used to select which half of the address register is to be loaded or which portion of the data register in the Data Path Array is to be loaded or read. |
| MP_ADDINCB | Signal from the Maintenance Controller 12 causing the value in the Data Path Array address register 12a to be incremented by one. |

Note signals ending in "B" are active low.

Thus, the direct interface while minimal as to hardware impact, is quite significant as to providing enhancement of the read channel microcode loop. The address value need only be issued once by the maintenance controller 12 by thereafter can be easily and quickly incremented to the next address value by the Control PAL 16. Further, the data values read from the main memory 40 as channel microcode values can be easily steered to the maintenance controller 12 in a fraction of the time and effort previously required. Further, and most significantly, the priorly required time for the maintenance software in the maintenance processor 64 to calculate the new address each time, has now been saved. Once the address is resident in the data path array 20, all that is necessary to emulate the processor paths to the main memory 40 in the system bus 22, is that the necessary high-speed control signals be activated as they would for normal processor operations. This is done by means of the maintenance controller 12 and the Control PAL 16 of FIG. 1.

Enhanced Mode—Control PAL 16 (FIG. 1)

The Control PAL 16 functions as a master logic unit which decodes processor commands and controls the steering of all data into and out of the data path array 20. The Control PAL 16 also provides all the control signals and timing required for the system bus operations to or from main memory 40. All bus traffic on the processor bus $14_b$ is directed by signals from the Control PAL 16. The Control PAL 16 controls all actions at the faster and full clock speed of the processor 14. Further, all bus access and protocol for the system busses $22_a$ and $22_b$ operations is directed by signals from the Control PAL 16. Thus, all the necessary controls are already in place to read data over the system bus 22 from the main memory 40. The Control PAL 16 already has the required signals necessary to steer the address values in the data path array 20 onto the system busses $22_a$ and $22_b$. All control signals are already present to receive memory data into the data path array 20 from the system busses. Further, signals already exist for all system bus and main memory operations. The Control PAL 16 can function at the full processor speed rather than some slow, serial type operation as would be required on the JTAG lines $12_d$ or $12_p$ and $12_c$. The normal control signals used by Control PAL 16 are shown below in Table II.

TABLE II

SIGNALS FROM CONTROL PAL 16

| NWB_OUTB | Signal when active indicates that a non-write type memory operation is active. This signal initiates a system bus access and system bus cycle for non-write type (e.g. reads) |
|---|---|

TABLE II-continued

SIGNALS FROM CONTROL PAL 16

| | |
|---|---|
| | operation. |
| BIU_CMD(2:0) | Signals indicating the type of active system operation; equals "000" for system bus single word read operations. |
| DOUT_MSEL(3:0) | Bus steering controls to the Data Path Array. Controls what values are driven onto the system busses. |
| RDCMPLT | Signal indicating that the current system bus operation has completed successfully. For a Write operation, this signal indicates that the Write operation is totally complete. For a Read operation, this signal indicates the availability of the system Read data with the Data Path Array registers. |
| G_DRIVEB | Signal enabling Data Path Array to drive out memory data onto processor bus. |
| G_LDINB | Signal causing data on the processor bus to be strobed into input register of the Data Path Array. |
| G_MSEL(3:0) | Signals controlling the steering of data within the Data Path Array onto the processor bus. For SA bus, =0000; for SB bus =0100. |

It should be noted that each of these signals were previously used in the earlier architecture in the Control PAL 16. What the present improved system does for enhancement is to add a simple, direct way by which the maintenance controller 12 can initiate and cause the sequences that normally control these signals of Table III to be executed. In effect, the new direct controls of the maintenance controller 12 simply do a "logic-OR" into the existing control logic for these signals.

The control signals shown in Table III are used in logic equations which effectuate the functioning of this system. These new logic equations are also shown in Table III below. The newly added maintenance controller terms are denoted. From these equations in Table I and II, it can be seen that very little new logic needed to be added to the existing control terminology in order to provide the fast read path.

TABLE III

| LOGIC EQUATION | DESCRIPTION |
|---|---|
| NWB_OUTB= | |
| RDMISSFF/* RDLKDLYFF/ | normal logic |
| * (MPFF3 * MP_WRB)/ | maintenance controller term |
| BIU_CMD(2) = | |
| SNDMSGFF*RTODFF/ | normal logic |
| + WB_OUT | normal logic |
| + READLKFF | normal logic |
| BIU_CMD(1) = | |
| WB_OUT | normal logic |
| + READLKFF | normal logic |
| + RDMISSFF * READ4 | normal logic |
| BIU_CMD(0) = | |
| SNDMSGFF * WB_OUT/ | normal logic |
| + RTODFF * WB_OUT/ | normal logic |
| + READLKFF * WB_OUT/ | normal logic |
| + RDMISSFF * WB_OUT/ * READ4 | normal logic |
| DOUT_MSEL(3,2) | |
| . . . | normal logic |
| + WRITE * MPFF3/ | maintenance controller term |
| DOUT_MSEL(1) = | |
| . . . | normal logic |
| + MPFF3 | normal logic |

TABLE III-continued

| LOGIC EQUATION | DESCRIPTION |
|---|---|
| DOUT_MSEL(0) = | |
| . . . | normal logic |
| + MPFF3*(A_CVOUTF+B_CVOUTF) | maintenance controller term |
| RDCMPLT := | |
| RDCMPLT/*SCMPLTFF*RDMISSFF | normal logic |
| + . . . | normal logic |
| + RDCMPLT/*SCMPLTFF*MPFF3 | maintenance controller term |
| G_DRIVEB := | |
| BIUFF2 + MEMFF2 * RDMISSFF | normal logic |
| + . . . | normal logic |
| + MPFF2 * MP_MEM_OP | maintenance controller term |
| G_LDINB := . . . | |
| BIUOPFF + MEM_OP | normal logic |
| + MPFF2 * MPFF3/ | maintenance controller term |
| G_MSEL(3,1,0) := . . . | normal logic |
| G_MSEL (2) := . . . | normal logic |
| + | |
| MPFF2*MP_MEMOP*B_BUSACTIVEF | maintenance controller term |

Signals ending in "B" are active low
Notes:
:= means to set a D-Flip-flop
+ means logical-or
/ means logical-not
= means a gate (combinatorial) term
* means logical-and
. . . means more normal logic not shown In addition to the new "OR" terms seen in Table III, a short, new sequence was provided to handle the protocol for the direct control from the maintenance controller 12. This new sequence was inserted into the Control PAL 16. This is described in the following section involving the new mode direct protocol.

Enhanced Mode—Direct Protocol

In order to provide the ability to emulate the usage of the high-speed wide bus structure $12_b$ by the maintenance controller 12, a four-signal direct interface is made between the maintenance controller 12 and the Control PAL 16. This is seen in FIG. 1 by the control lines $12_c1$. The Control PAL 16 operates at the maximum clock rate which is the high speed of the processor 14. The maintenance controller 12 operates at a much slower clock rate and thus the new direct interface must provide for this asynchronous condition. This is accomplished by a hand-shaking arrangement. Of the four new signals in the direct interface, $12_c1$, only three are used for reading the channel microcode words from main memory. The signals involved are given in Table IV.

TABLE IV

| INTERFACE SIGNALS ON BUS 12c1 (FIG. 1) | |
|---|---|
| MP_WRB | (not used here). |
| MP_DONEB | Return handshake signal from the Control PAL 16 indicating that the current operation is now complete. |
| MP_RDB | Control signal from the Maintenance Controller 12 indicating that the Control PAL 16 should execute a read operation. |
| MP_MEMOP | Signal from the Maintenance Controller 12 indicating that the Control PAL 16 should execute a system bus (Memory) type of operation. |

These are active low signals.

The incoming signal of MP_RDB in Table IV is captured and synchronized to the processor clock rate with a flip-flop designated MPRDBFFB within the Control PAL 16. This flip-flop is then used in the control sequence. As seen in FIG. 1, three flip-flops 16f (FF1,2,3) which are internal to the Control PAL 16 are used to control the sequence of the protocol and the fast transfer bus 12b controls. These flip-flops are called MPFF1, MPFF2, MPFF3.

Figure 4:
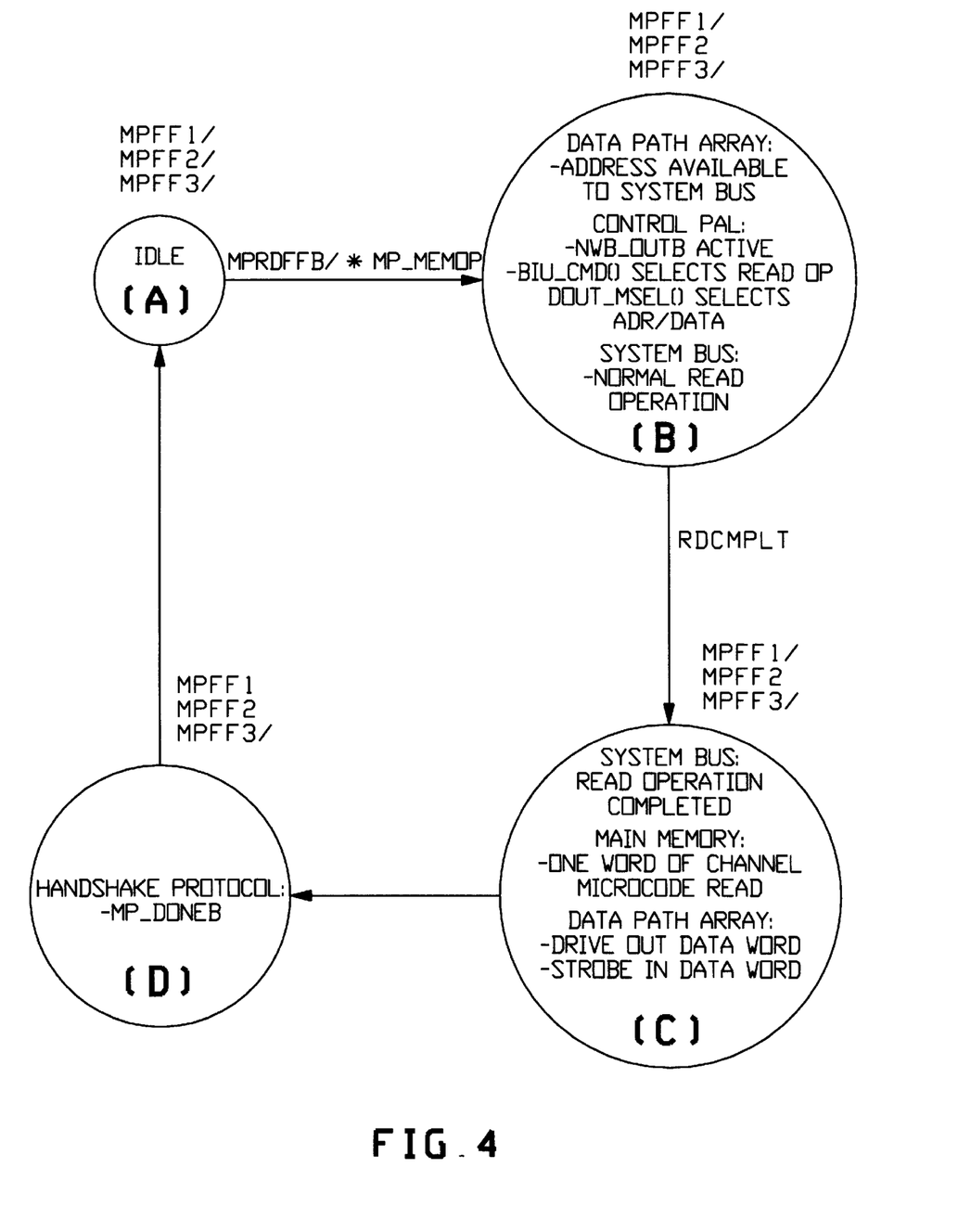
FIG. 4 is a schematic diagram showing the sequence of operations for reading out a word of channel microcode data and transferring this data to the maintenance controller for verification.

FIG. 4 is a schematic diagram showing the sequence of control operations from conditions A, B, C, and D. The Idle condition at (A) shows that each of the three control flip-flops are off. After this, the maintenance controller 12 initiates a read operation and memory operation in order to effectuate the results at (B). Here, the data path array 20 makes addresses available to the system bus and the Control PAL 16 selects a read operator and provides a Read operation on the system bus to access the main memory 40. When the read command is completed, the system at (C) shows that the Read operation has been completed over the system bus and that one word of channel microcode has been placed in the data path array 20. It is seen at (C) that while flips-flops 1 and 3 are "off," the flip-flop 2 is turned "on". Subsequently, at the status position (D), the flip-flops 1 and 2 are "on," and flip-flop 3 is "off" in order to complete the handshake protocol to show that the cycle is finished and can return to the Idle position (A).

Figure 5:
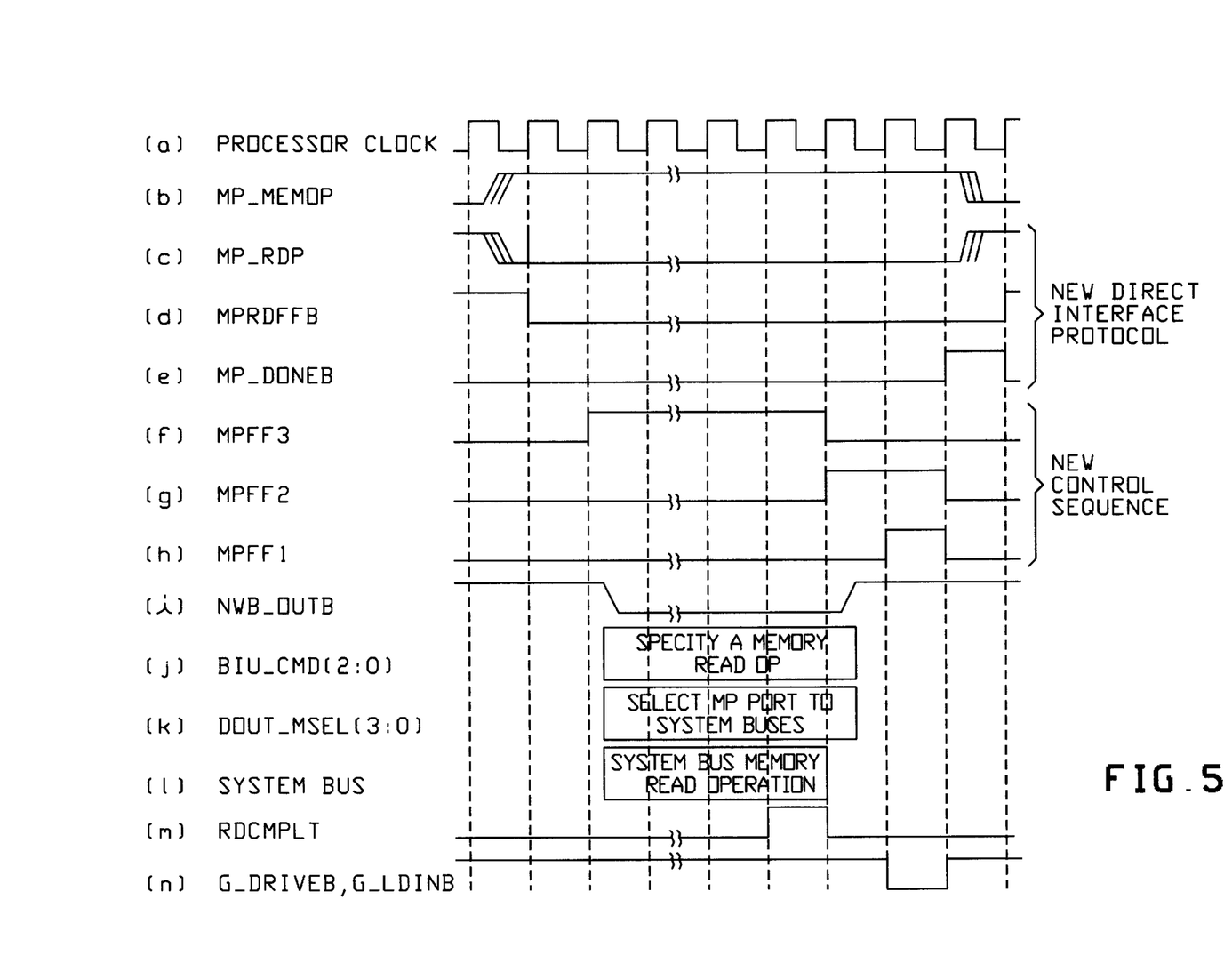
FIG. 5 is a timing diagram showing the signals involving the direct interface protocol and the new control sequences for providing fast read-out from main memory of channel microcode data for subsequent verification by the maintenance controller.

FIG. 5 is a timing diagram showing the timing of the protocol, the three sequence flip-flops, and the various normal control signals used in reading the channel microcode over the system bus from main memory through the data path array to the maintenance controller 12 for verification against the data in the flash memory 15.

FIG. 5 indicates how the processor path emulation sequence occurs in the fast reading of channel microcode. First, the maintenance controller 12 initiates a "Read" operation using the newly enhanced direct protocol signals, MP_MEMOP and MP_RDB, Table IV. With these signals, the maintenance controller 12 signals to the Control PAL 16 that a Read operation to memory is desired. These signals cause the third flip-flop MPFF3 of the enhanced control sequence to be set as shown in FIGS. 4 and 5. This control flip-flop then accomplishes most of the remaining effort to be accomplished. As was seen in the equations of Table III, the normal signal designated, NWB_OUTB (line (i) of FIG. 5) is forced "on" by the third flip-flop MPFF3, line (f). Once the signal NWB_OUTB is "on", it automatically operates through all the normal Control PAL logic to cause a system bus operation to occur. This logic automatically does a memory read operation into main memory 40. The only special actions taken are that the signals "DOUT_MSEL (3:0)", line (k) for the steering of the maintenance port address (in the data path array 20) onto the system busses $22_a$ and $22_b$.

As with the normal control logic there is a delay or wait time while the slower system bus ($22_a$ and $22_b$) operation takes place. When this operation is complete, the signal RDCMPLT, line (m) is issued, which indicates the completion of the Read operation. This signal then terminates the enhanced control sequence and the enhanced direct protocol procedures. Thus, a full-speed, normal system bus Read operation occurs to main memory 40 on behalf of the maintenance controller for the reading out of channel microcode from memory and subsequent verification by the maintenance controller 12 using the flash memory RAM 15.

The new enhanced fast emulation path will be seen as being implemented with very little additional hardware cost. The new transfer bus 12b and the controls $12_c1$ and $12_c2$ into the data path array may take up 22 additional array connection pins. However, in most cases, these pins are already available and thus the change to the data path array is on a cost-free basis. Also, the extra silicon used internally within the data path array is there for the taking. In the case of the new enhanced direct interface protocol sequence and the extra "OR" terms, these are all built in the Control PAL 16 and this is completely implemented using the spare capacity within the existing programmable array logic 16 and thus no new hardware is added. The interconnections for the control signals and the transfer bus 12b, of course, do add a few more etch connections on the printed circuit board. However, the cost of these are actually almost negligible.

The herein described fast read and verification system with a enhanced path emulation enabling a large channel microcode data base to be quickly read out from the main memory and verified each time the system is initialized, will be seen to be a most efficient implementation and rapid transfer of information quite superior to the prior art usage. By using the existing high-speed, wide bus path and emulating the normal controls utilized by the high speed processor logic, the system allows the reading to be virtually invisible to the human operator. In the earlier architectural systems, the time to load, read and verify the channel microcode was measurable in long minutes and is now accomplished in a matter of a few seconds.

While the above-described enhanced system for fast read and verify of main memory has been described in a preferred embodiment, other embodiments may also utilize the concept which is defined in the following claims.

What is claimed is:

1. In a network wherein a maintenance subsystem pre-loads blocks of microcode data to a flash memory unit appended to a maintenance controller means in a central processing module (CPM) with a high speed processor data bus connecting a central processor, a microcode RAM and data path array, a system for the rapid readout and verification of blocks of microcode data residing in a main memory module during initialization, comprising:

(a) a data path array means, connected via dual system busses to a main memory module, for temporary storage of said microcode data being transferred from said main memory module to said maintenance controller means, said data path array means further includes:

(a1) an address register for holding the address of each microcode word retrieved from said main memory module;

(a2) a data register for holding each microcode word retrieved from said main memory module;

(b) a programmable array logic control means for addressing said main memory module and transferring said microcode data to said data path array means and including:

(b1) means to convey said microcode data from said data path array means to said maintenance controller means via a fast auxiliary data transfer bus comparable to the speed of said processor data bus;

(c) said maintenance controller means for receiving said microcode data from said main memory module and including:

(c1) a flash memory unit for holding a copy of said microcode data pre-loaded from said maintenance subsystem before initialization;

(c2) means to compare said microcode data, received from said main memory modules, with said copy of microcode data in said flash memory unit to verify the integrity of each word of said microcode data;

(d) said fast auxiliary data transfer bus functioning under the control of said maintenance controller means and said programmable array logic control means for providing high rate parallel capacity data transfer to said maintenance controller means from data in said data path array means which was received from said main memory module means;

(e) said dual system busses connecting said data path array means to said main memory module means and to a plurality of I/O modules;

(f) each of said I/O modules operating to access and utilize a particular block of microcode data in said main memory module means after initialization and verification.

2. The system of claim 1 wherein said microcode data includes a plurality of microcode instruction words and an address for each said word.

3. The system of claim 1 wherein said maintenance controller means includes:

(a) means to initiate the first address for retrieval of each microcode word from said main memory module; and (b) means to automatically increment said first address and succeeding addresses until all of said microcode words have been read out from said main memory module and transferred to said maintenance controller means for verification.

4. A method, during system initialization, for the fast readout of blocks of microcode words from a main memory module and for integrity verification by a maintenance controller in a central processing module having a central processor utilizing a high speed processor bus which enables data transfers between an associated microcode RAM and a data path array means, said method comprising the steps of:

(a) addressing each microcode word residing in said main memory module;

(b) transferring each addressed microcode word to said data path array means which holds an address register and a data register for receiving said microcode words from said main memory module;

(c) conveying each microcode word in said data path array means to said maintenance controller via an auxiliary high speed data bus which emulates the speed of said processor bus of said central processor in said central processing module;

(d) using a pre-loaded flash memory unit holding a valid copy of the original microcode words derived from an associated maintenance subsystem, to compare and verify the integrity of each microcode word retrieved from said main memory module;

(e) said associated maintenance subsystem for preloading said microcode words into said flash memory for utilization during system initialization and verification;

(f) utilizing dual system busses to enable a plurality of I/O modules to access designated blocks of microcode words for initialization of each of said I/O modules.

5. In a network initialization operation wherein a central processing module has a maintenance controller means with flash memory preloaded with original blocks of microcode data words from a maintenance subsystem, and wherein said central processing module includes a central processor having a high speed processor bus connected to a data path array means, an interface system for high speed data transfer, at speeds comparable to said processor bus, of blocks of microcode words from a main memory module through said data path array means to said maintenance controller means for verification against said original blocks of microcode data words, said interface system comprising:

(a) said data path array means connected via dual system busses to said main memory module for retrieving data words for temporary storage during a read operation from said main memory module;

(b) direct interface means for conveying said main memory's blocks of microcode data words to said maintenance controller means via a high speed auxiliary data bus of comparable speed to said high speed processor bus, said direct interface means including:

(b1) said high speed auxiliary data bus providing a data transfer channel for moving said main memory module's blocks of microcode data words from said data path array means to said maintenance controller means;

(b2) a programmable array logic control means for addressing said main memory module data words for transfer to said maintenance controller means via said auxiliary data bus;

(b3) said maintenance controller means for receiving said main memory module's blocks of microcode data words and comparing each said microcode data word with said original data word to establish verification of each said microcode data word, and including:

(b3a) flash memory means holding said pre-loaded original blocks of microcode data words for use as a standard of comparison by said maintenance controller means to each of said blocks of microcode data words received from said main memory module;

(c) said main memory module connected by said dual system busses to said data path array means and to a plurality of I/O modules;

(d) each said plurality of I/O modules having a particular block of microcode data words for access from said main memory module for initialization of its operating functions.

6. A system for high speed delivery of channel microcode data during network initialization to a main memory module with rapid read out and verification of operating data in said main memory module, said network involving a central processing module having a central processor with a high speed processor data bus connecting a microcode RAM and data path array, said system comprising:

(a) a maintenance subsystem for preliminarily delivering blocks of microcode data to a flash memory appended to a maintenance controller in a central processing module;

(b) said central processing module for delivering said blocks of microcode data to said main memory module and for returning said blocks of microcode data to said maintenance controller with said appended flash memory, said central processing module including:

(b1) a maintenance controller means with appended flash memory for reading out and verifying each said block of microcode data returned from said main memory module;

(b2) a data path array means, connected via dual system busses to said main memory module, for temporary storage of said microcode data being transferred from said main memory module to said maintenance controller means;

(b3) a programmable array logic control means for addressing said main memory module and transferring said microcode data to/from said data path array means and including:

(b3a) means to convey said microcode data from said data path array means to said maintenance controller means via a fast auxiliary data transfer bus comparable to the speed of said processor data bus;

(b4) said maintenance controller means for receiving said microcode data from said main memory module and including:
- (b4a) a flash memory unit for holding a copy of said microcode data pre-loaded from a maintenance subsystem before initialization;
- (b4b) means to compare said microcode data, received on a fast auxiliary data transfer bus from said main memory module, with said copy of microcode data in said flash memory unit to verify the integrity of each word of said microcode data;

(b5) said fast auxiliary data transfer bus functioning under the control of said maintenance controller means and said programmable array logic control means for providing high rate parallel capacity microcode data transfer to said maintenance controller means from microcode data in said data path array means which was received from said main memory module;

(c) dual system bus means connecting said data path array means to said main memory module and to a plurality of I/O module means;

(d) said I/O module means for accessing and utilizing an assigned block of microcode data from said main memory module after initialization and verification of each block of microcode data.

* * * * *